(12) United States Patent
Liu et al.

(10) Patent No.: US 12,094,772 B2
(45) Date of Patent: Sep. 17, 2024

(54) ELECTRONIC DEVICE PACKAGE AND METHOD OF MANUFACTURING THE SAME

(71) Applicant: Advanced Semiconductor Engineering, Inc., Kaohsiung (TW)

(72) Inventors: Wei-Wei Liu, Kaohsiung (TW); Huei-Siang Wong, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 139 days.

(21) Appl. No.: 17/151,067

(22) Filed: Jan. 15, 2021

(65) Prior Publication Data

US 2022/0230915 A1 Jul. 21, 2022

(51) Int. Cl.
*H01L 21/768* (2006.01)
*H01L 23/00* (2006.01)
*H01L 23/488* (2006.01)
*H01L 23/498* (2006.01)
*H01L 23/522* (2006.01)

(52) U.S. Cl.
CPC .. *H01L 21/76873* (2013.01); *H01L 21/76802* (2013.01); *H01L 21/76877* (2013.01); *H01L 23/488* (2013.01); *H01L 23/49822* (2013.01); *H01L 23/5226* (2013.01); *H01L 24/14* (2013.01)

(58) Field of Classification Search
CPC ......... H01L 23/49822; H01L 23/49833; H01L 23/5226; H01L 24/14; H01L 21/76877; H01L 23/498
See application file for complete search history.

(56) References Cited

U.S. PATENT DOCUMENTS

| | | | |
|---|---|---|---|
| 10,418,314 B2* | 9/2019 | Lu | H01L 21/4857 |
| 11,276,632 B2* | 3/2022 | Jung | H01L 23/49838 |
| 11,776,885 B2* | 10/2023 | Ho | H01L 21/6835 257/668 |
| 2009/0218124 A1* | 9/2009 | Magera | H05K 3/3436 29/852 |
| 2011/0139502 A1* | 6/2011 | Kobayashi | H01L 21/4857 174/261 |
| 2015/0214170 A1* | 7/2015 | Chen | H01L 24/13 257/737 |
| 2016/0013138 A1* | 1/2016 | Chen | H01L 23/585 257/774 |
| 2020/0083189 A1* | 3/2020 | Chen | H01L 23/5389 |
| 2021/0020584 A1* | 1/2021 | Yu | H01L 21/561 |

* cited by examiner

*Primary Examiner* — Phat X Cao
(74) *Attorney, Agent, or Firm* — FOLEY & LARDNER LLP

(57) ABSTRACT

An electronic device package and a method for manufacturing the same are provided. The electronic device package includes a substrate, a conductive trace, a passivation layer and an upper wiring. The conductive trace is disposed over the substrate. The conductive trace includes a body portion disposed on the substrate, and a cap portion disposed on the body portion, and the cap portion is wider than the body portion. The passivation layer covers the conductive trace. The upper wiring is disposed on the passivation layer and electrically connected to the cap portion of the conductive trace through an opening of the passivation layer.

7 Claims, 24 Drawing Sheets

ELECTRONIC DEVICE PACKAGE AND METHOD OF MANUFACTURING THE SAME

TECHNICAL FIELD

The present disclosure generally relates to an electronic device package and method of manufacturing the same, and more particularly, to an electronic device package including a stress barrier structure in an interface between a conductive trace and a passivation layer and method of manufacturing the same.

BACKGROUND

In a conventional electronic device package, the coefficient of thermal expansion (CTE) mismatch of adjacent materials results in stress in the interface, particularly when the electronic device package undergoes thermal cycles. The stress in the interface between different materials may causes delamination, which thus deteriorates the yield and reliability of electronic device package.

SUMMARY

In some arrangements, an electronic device package includes a substrate, a conductive trace, a passivation layer and an upper wiring. The conductive trace is disposed over the substrate. The conductive trace includes a body portion disposed on the substrate, and a cap portion disposed on the body portion, and the cap portion is wider than the body portion. The passivation layer covers the conductive trace. The upper wiring is disposed on the passivation layer and electrically connected to the cap portion of the conductive trace through an opening of the passivation layer.

In some embodiments, an electronic device package includes a substrate, a conductive trace, a stress barrier structure, a passivation layer and an upper wiring. The conductive trace is disposed over the substrate. The stress barrier structure is connected to an edge of the conductive trace. The passivation layer covers the conductive trace. The upper wiring is disposed on the passivation layer and electrically connected to the conductive trace through an opening of the passivation layer.

In some embodiments, a method of manufacturing an electronic device package includes providing a substrate having a sacrificial layer with a hole. A conductive material is electroplated in the hole of the sacrificial layer to form a conductive trace, wherein the conductive material is excessively electroplated such that the conductive trace protrudes out from the hole and a protrusion portion is formed. The sacrificial layer is removed. A passivation layer is formed to cover the conductive trace.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1:
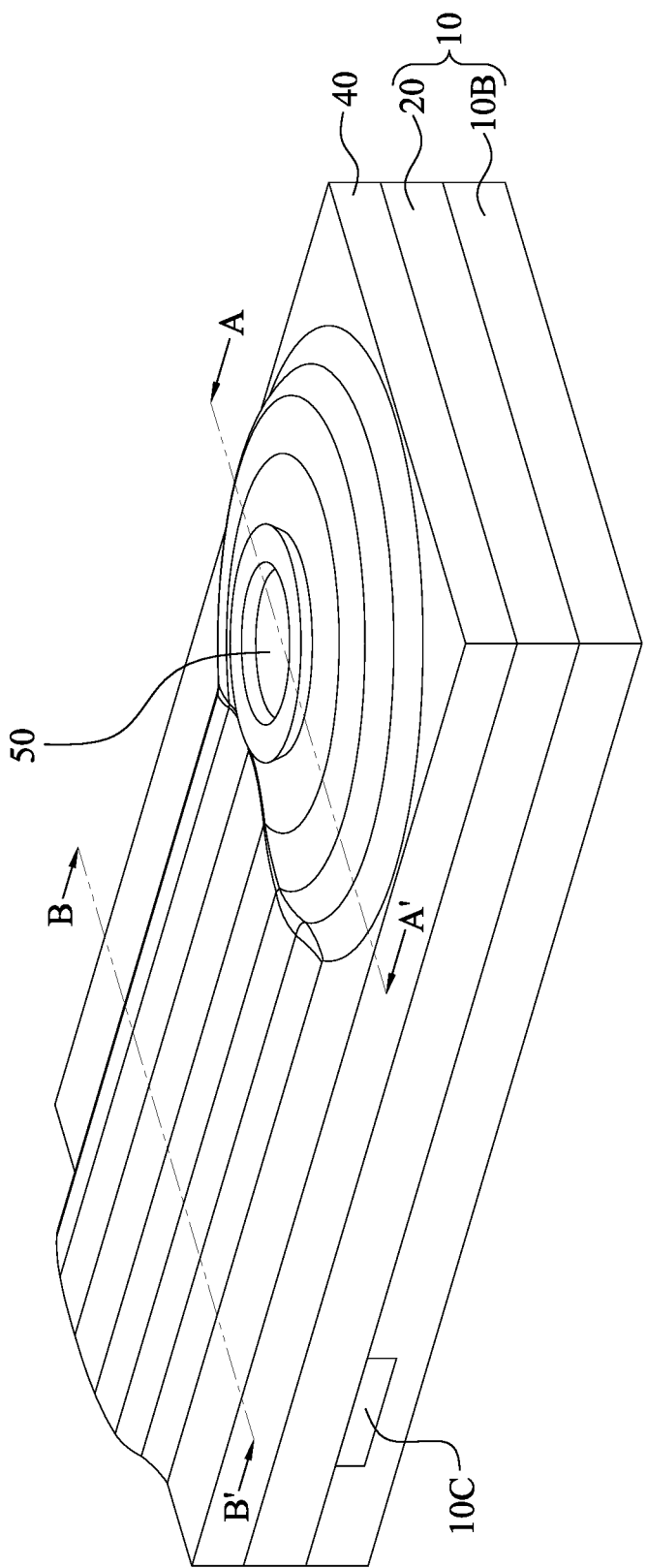
FIG. 1 is a perspective view of an electronic device package in accordance with some arrangements of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
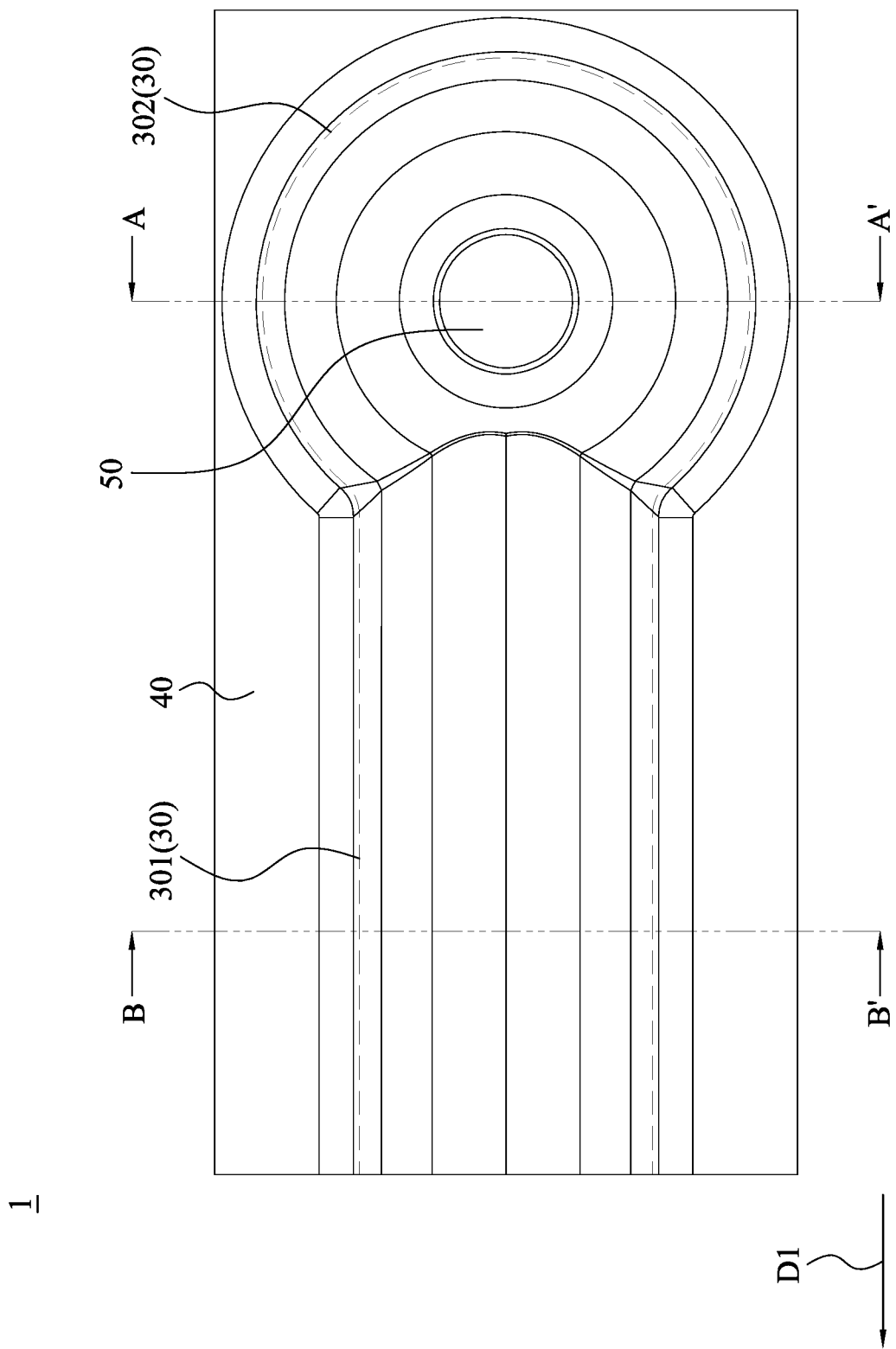
FIG. 1A is a schematic top view of an electronic device package in accordance with some arrangements of the present disclosure.
Figure 1B:
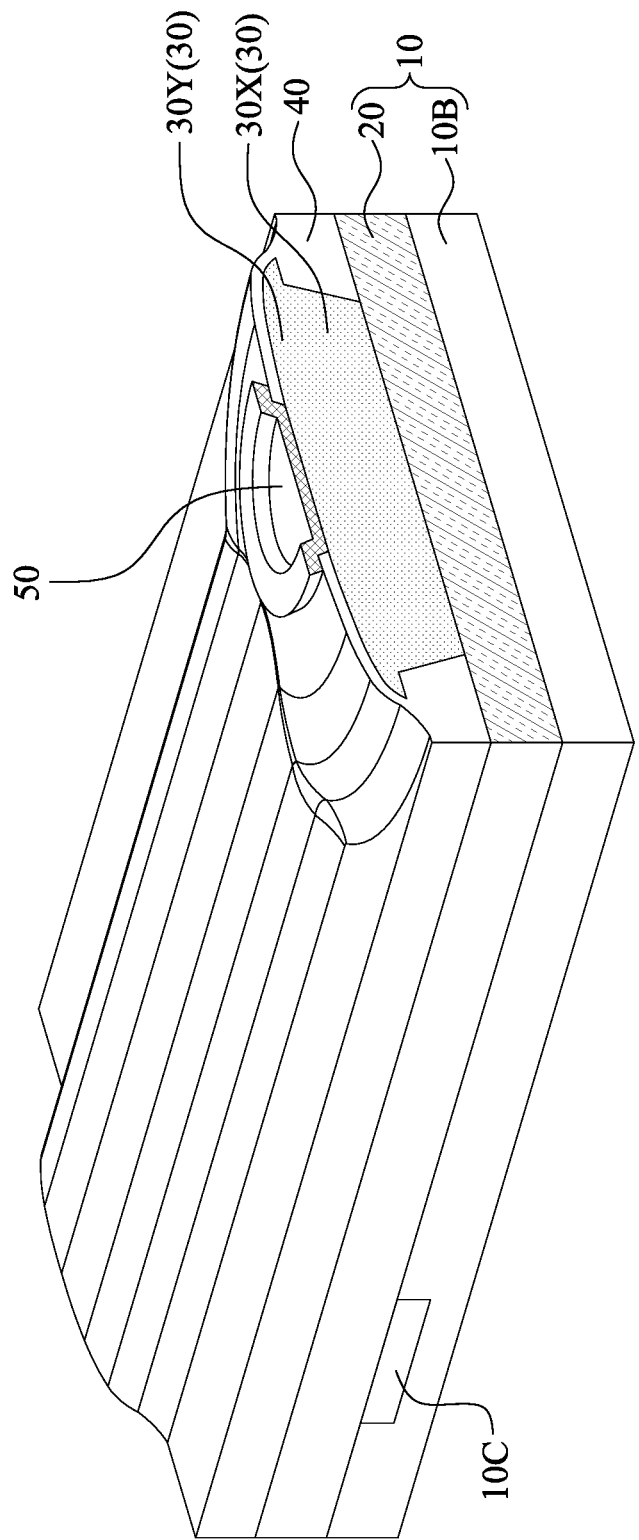
FIG. 1B is a schematic cross-sectional perspective view of an electronic device package along line A-A' in FIG. 1 in accordance with some arrangements of the present disclosure.
Figure 1C:
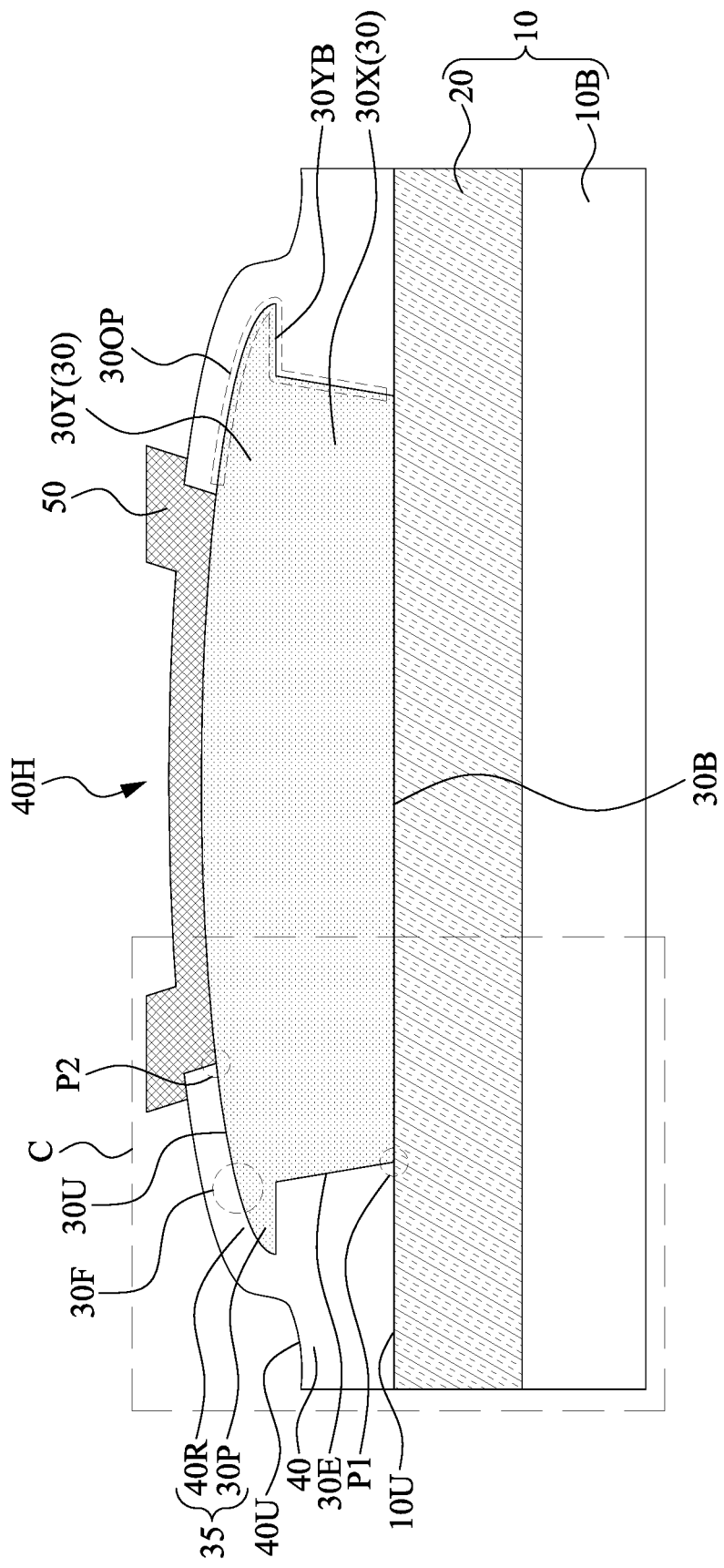
FIG. 1C is a schematic cross-sectional view of an electronic device package along line A-A' in FIG. 1A in accordance with some arrangements of the present disclosure.
Figure 1D:
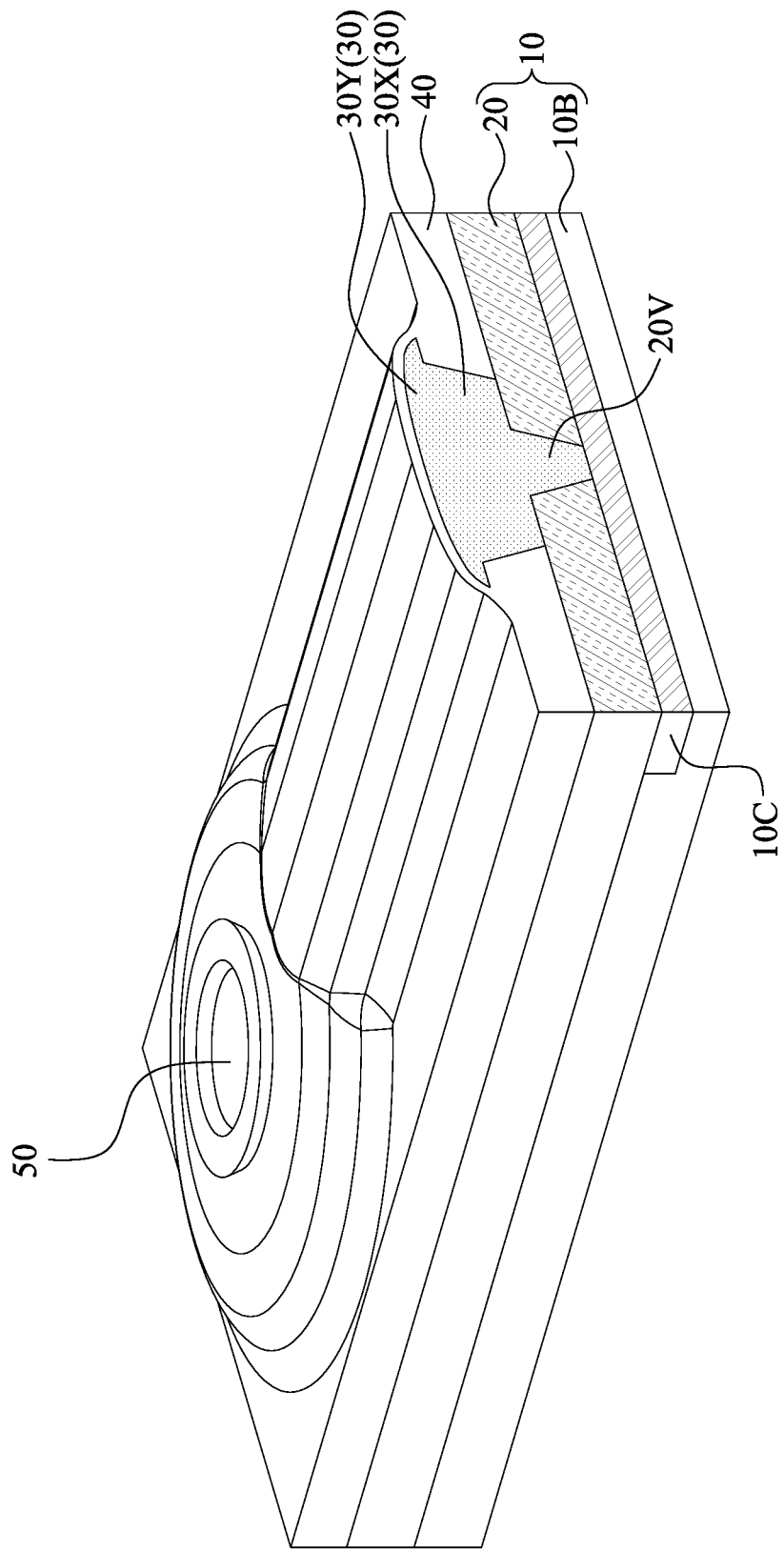
FIG. 1D is a schematic cross-sectional perspective view of an electronic device package along line B-B' in FIG. 1 in accordance with some arrangements of the present disclosure.
Figure 1E:
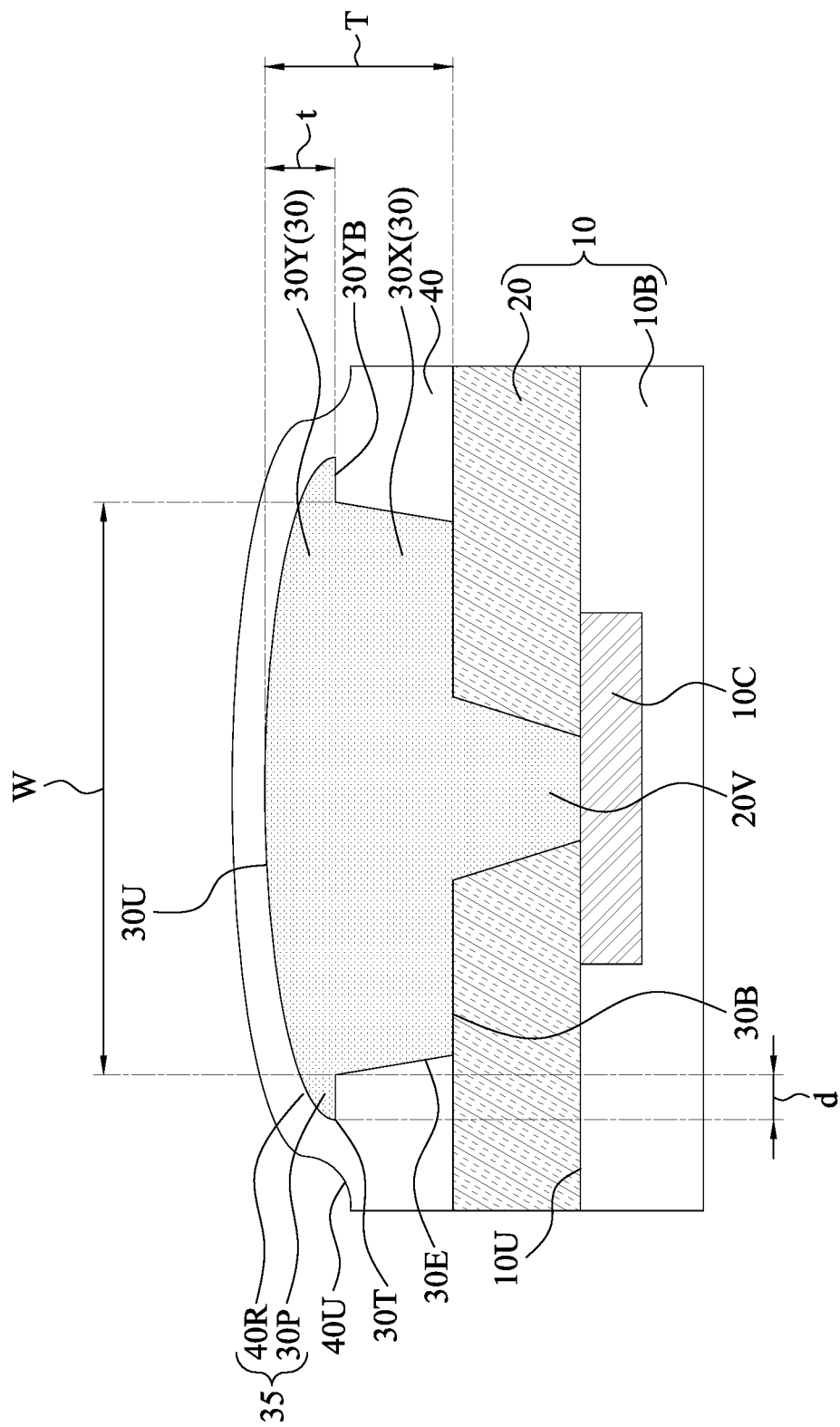
FIG. 1E is a schematic cross-sectional view of an electronic device package along line B-B' in FIG. 1A in accordance with some arrangements of the present disclosure.
Figure 1F:
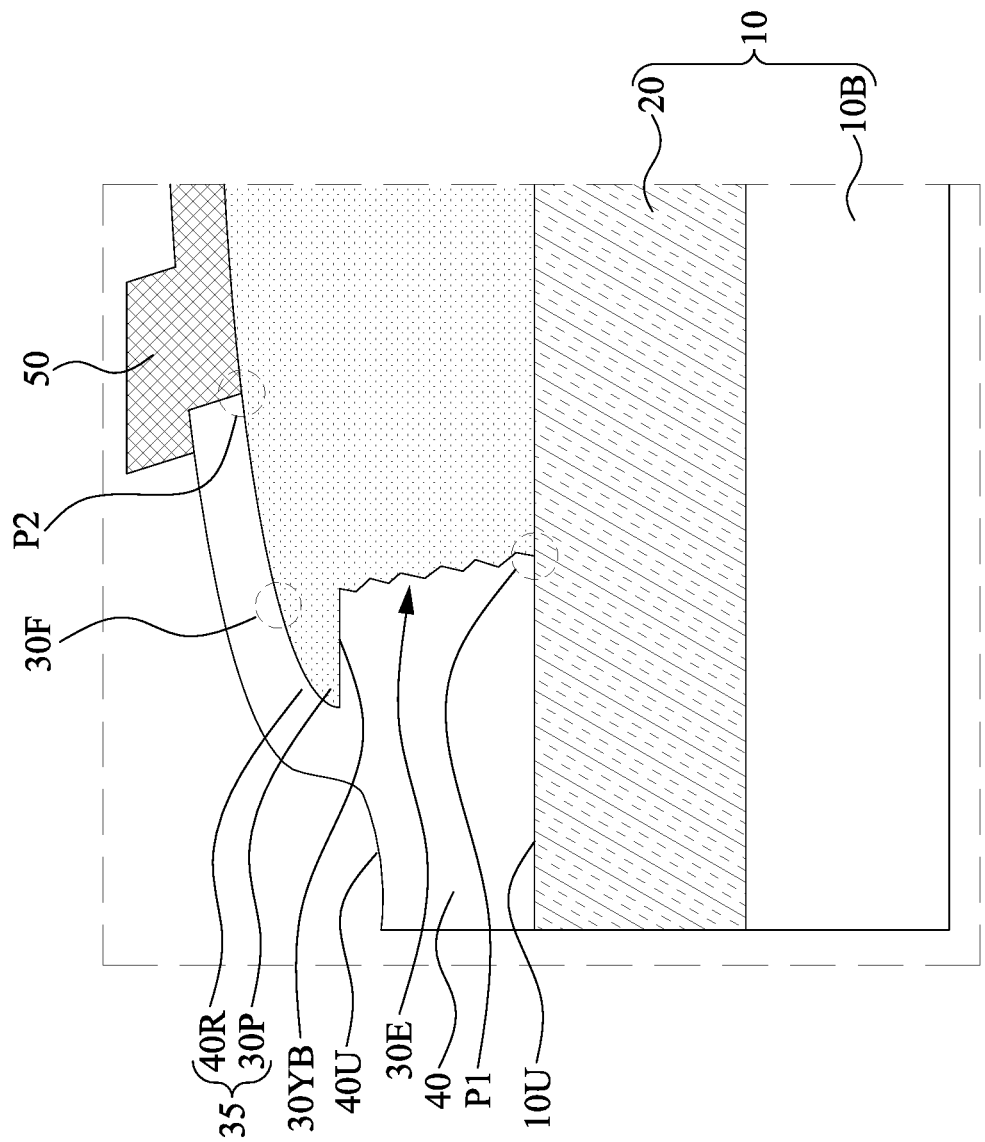
FIG. 1F is an enlarged schematic view of a region C of an electronic device package in FIG. 1C in accordance with some arrangements of the present disclosure.

FIG. 1 is a perspective view of an electronic device package 1 in accordance with some arrangements of the present disclosure, FIG. 1A is a schematic top view of an electronic device package 1 in accordance with some arrangements of the present disclosure, FIG. 1B is a schematic cross-sectional perspective view of an electronic device package 1 along line A-A' in FIG. 1 in accordance with some arrangements of the present disclosure, FIG. 1C is a schematic cross-sectional view of an electronic device package 1 along line A-A' in FIG. 1A in accordance with some arrangements of the present disclosure, FIG. 1D is a schematic cross-sectional perspective view of an electronic device package 1 along line B-B' in FIG. 1 in accordance with some arrangements of the present disclosure, FIG. 1E is a schematic cross-sectional view of an electronic device package 1 along line B-B' in FIG. 1A in accordance with some arrangements of the present disclosure, and FIG. 1F is an enlarged schematic view of a region C of an electronic device package 1 in FIG. 1C in accordance with some arrangements of the present disclosure. As shown in FIGS. 1 and 1A-1F, the electronic device package 1 includes a conductive trace 30, a passivation layer 40 and an upper wiring 50. In some embodiments, the conductive trace 30 is disposed over a substrate 10. The substrate 10 may include a semiconductor die or other type of substrate. The substrate 10 may include a base 10B such as a silicon wafer including transistors and a circuit layer 10C formed thereon, and a dielectric layer 20 disposed over the base 10B. The conductive trace 30 may be a trace line of a circuit layer such as a redistribution layer (RDL) or a portion of a trace line of an RDL. In some embodiments, the conductive trace 30 may, but is not limited to, be a single-layered RDL or a portion of a single-layered RDL. The material of the conductive trace 30 may include metal such as copper or other conductive material. The dielectric layer 20 may include organic dielectric material such as polyimide or the like. The dielectric layer 20 may be a part of the substrate 10 or subsequently formed on the substrate 10. In some embodiments, a conductive structure 20V such as a conducive via may be disposed in the dielectric layer 20 and electrically connected to the circuit layer 10C of the substrate 10. The conductive structure 20V may be partially exposed from the dielectric layer 20, and electrically connected to the conductive trace 30.

The conductive trace 30 may include a body portion 30X disposed on the substrate 10, and a cap portion 30Y disposed on the body portion 30X. The body portion 30X and the cap portion 30Y may be made of the same conductive material and monolithically formed. The cap portion 30Y is wider than the body portion 30X. The conductive trace 30 includes an outer profile 30OP including an edge 30E and an upper surface 30U angled with the edge 30E. In some embodiments, the conductive trace 30 further includes a bottom surface 30B, and the edge 30E is connected to the bottom surface 30B and the upper surface 30U. The edge 30E of the outer profile 30OP is inclined with respect to the bottom surface 30B of the conductive trace 30. By way of example, the edge 30E of the outer profile 30OP is inclined outwardly with respect to the bottom surface 30B of the conductive trace 30. Alternatively, the edge 30E of the outer profile 30OP may be inclined inwardly with respect to the bottom surface 30B of the conductive trace 30. In some embodiments, the conductive structure 20V and the conductive trace 30 may be integrally formed in the same deposition process such as electroplating process. In some other embodiments, the conductive structure 20V and the conductive trace 30 may be formed separately in different processes.

The passivation layer 40 covers the conductive trace 30. In some embodiments, the passivation layer 40 includes an opening 40H as illustrated in FIG. 1C partially exposing the upper surface 30U of the conductive trace 30. In some embodiments, the passivation layer 40 may include organic dielectric material such as polyimide or the like. The upper wiring 50 may partially cover the passivation layer 40, and may be connected to the upper surface 30U of the conductive trace 30 through the opening 40H of the passivation layer 40. In some embodiments, the upper wiring 50 may include a non-solder material. By way of example, the upper wiring 50 may include an under bump metallurgy (UBM), but is not limited thereto. As shown in FIG. 1 and FIG. 1A, the conductive trace 30 may include an RDL including a routing portion 301 extending along a direction D1 on the substrate 10, and a landing pad portion 302 connected to the routing portion 301. The conductive trace 30 extends along the direction D1 on the substrate 10 to be outside a projection of the upper wiring 50 projected on the substrate 10. The projection of the upper wiring 50 which is configured as a UBM is within the landing pad portion 302 and outside the routing portion 301. In some other embodiments, the upper wiring 50 may be another RDL, or a portion of another RDL.

In some embodiments, the upper surface 30U of the conductive trace 30 includes a curved surface such as a convex surface. In some embodiments, the entire upper surface 30U of the conductive trace 30 may be curved without a planar region. In some other embodiments, the upper surface 30U of the conductive trace 30 includes a planar surface. A portion of the passivation layer 40 includes an upper surface 40U being a curved surface and substantially conformal with respect to the upper surface 30U of the conductive trace 30. The portion of the passivation layer 40 may further extend to be disposed between the cap portion 30Y of the conductive trace 30 and the upper wiring 50. The upper surface 40U of another portion of the passivation layer 40 may be lower than a bottom surface 30YB of the cap portion 30Y of the conductive trace 30. In some embodiments, the passivation layer 40 is in contact with the bottom surface 30YB of the cap portion 30Y of the conductive trace 30.

In some embodiments, the outer profile 30OP is referred to the outer surface of the conductive trace 30 covered by the passivation layer 40 as shown in FIG. 1C. The outer profile 30OP may interface with the passivation layer 40. For example, the outer profile 30OP of the conductive trace 30 may be in contact with the passivation layer 40. The outer profile 30OP includes a first portion P1 proximal to the substrate 10, a second portion P2 proximal to the upper wiring 50, and a protrusion portion 30P between the first portion P1 and the second portion P2. For example, the first portion P1 is adjacent to a boundary between the edge 30E and the bottom surface 30B; the second portion P2 is adjacent to a boundary between the passivation layer 40 and the upper wiring 50; and the protrusion portion 30P is a portion of the conductive trace 30 in the boundary between the upper surface 30U and the edge 30E, and protruding out from the edge 30E of the conductive trace 30. In some embodiments, the protrusion portion 30P may have a sharpened tip.

The passivation layer 40 may include a recession portion 40R covering and engaged with the protrusion portion 30P of the conductive trace 30. The recession portion 40R and the protrusion portion 30P form a lock configuration such that the passivation layer 40 can be interlocked with and firmly fixed to the conductive trace 30. The protrusion portion 30P forms a stress barrier structure 35 (also referred to as an interlocking structure) in an interface between the conductive trace 30 and the passivation layer 40. For example, the conductive trace 30 and the passivation layer 40 are interlocked such that the interface between the protrusion portion 30P of the conductive trace 30 and the recession portion 40R of the passivation layer 40 forms the stress barrier structure 35. The stress barrier structure 35 is disposed above an interface between the substrate 10 and the conductive trace 30. For example, the stress barrier structure 35 may be in contact with the interface between the substrate 10 and the conductive trace 30, or suspended over the interface between the substrate 10 and the conductive trace 30. In some embodiments, the projection of the stress barrier structure 35 on the substrate 10 partially overlaps the projection of the conductive trace 30 on the substrate 10.

By virtue of the stress barrier structure 35, the stress generated in the interface between the conductive trace 30 and the passivation layer 40 due to the CTE mismatch is turned by larger than 90 degrees, and thus stress propagation is mitigated or stopped and the delamination of the conductive trace 30 and the passivation layer 40 can be alleviated. In some embodiments, the outer profile 30OP further includes an intersection portion 30F between the edge 30E and the upper surface 30U of the conductive trace 30, and the protrusion portion 30P protrudes out from the intersection portion 30F. The protrusion portion 30P protruding from the intersection portion 30F can be configured to alleviate propagation of delamination from both the first portion P1 proximal to the substrate 10 (i.e., from the bottom side) and from the second portion P2 (i.e., from the top side).

The recession portion 40R and the protrusion portion 30P form a lock configuration such that the passivation layer 40 can be interlocked with and firmly fixed to the conductive trace 30. In some embodiments, the cap portion 30Y has a tip 30T distal to the edge 30E of the body portion 30X, and a distance d between the tip 30T of the cap portion 30Y and the edge 30E of the body portion 30X is equal to a length of the protrusion portion 30P. In some embodiments, a ratio of the distance d between the tip 30T of the cap portion 30Y and the edge 30E of the body portion 30X to a width W of the body portion 30X is ranging from about 0.67% to about 5%. By way of example, the width of the body portion 30X of the conductive trace 30 is ranging from about 20 micrometers to about 150 micrometers, and the distance d between the tip 30T of the cap portion 30Y and the edge 30E of the body portion 30X (i.e., the length of the protrusion portion 30P) is substantially equal to or greater than 1 micrometer, such that the protrusion portion 30P can be firmly engaged with the recession portion 40R of the passivation layer 40. The above d/W ratio is critical to the stress barrier effect for the following reasons. In case the d/W ratio is smaller than about 0.67%, the stress barrier structure 35 does not provide enough stress barrier effect, and thus the delamination inhibition effect is not sufficient. In case the d/W ratio is larger than about 5%, the pitch between the tip 30T of the cap portion 30Y of the conductive trace 30 and the tip 30T of the cap portion 30Y of another adjacent conductive trace 30 is too close, which may affect the layout of the conductive traces 30T. Thus, the stress barrier structure 35 having the d/W ratio ranging from about 0.67% to about 5% is able to provide sufficient stress barrier effect and satisfy the design rule of the pattern of the conductive traces 30.

In some embodiments, a ratio of a thickness t of the cap portion 30Y to an overall thickness T of the conductive trace 30 is larger than 1/3. The above t/T ratio is critical to the stress barrier effect for the following reason. In case, the t/T ratio is smaller than 1/3, the cap portion 30Y is too thin, which could be bended due to the stress, and thus fails to barricade the stress. Thus, the cap portion 30Y having the t/T ratio larger than 1/3 is able to provide sufficient stress barrier effect.

In some embodiments, the outer profile 30OP may include a rough surface as shown in FIG. 1F, and a surface roughness of the outer profile 30OP other than the protrusion portion 30P is ranged from about 20 nanometers to about 30 nanometers.

The protrusion portion 30P of the conductive trace 30 and the recession portion 40R of the passivation layer 40 interlock with each other, thereby not only forming an interlock structure structurally fasten the conductive trace 30 and the passivation layer 40, but also forming a stress barrier structure 35 that mitigates propagation of stress along the interface between the conductive trace 30 and the passivation layer 40. Accordingly, delamination issue can be effectively alleviated.

The electronic device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2A:
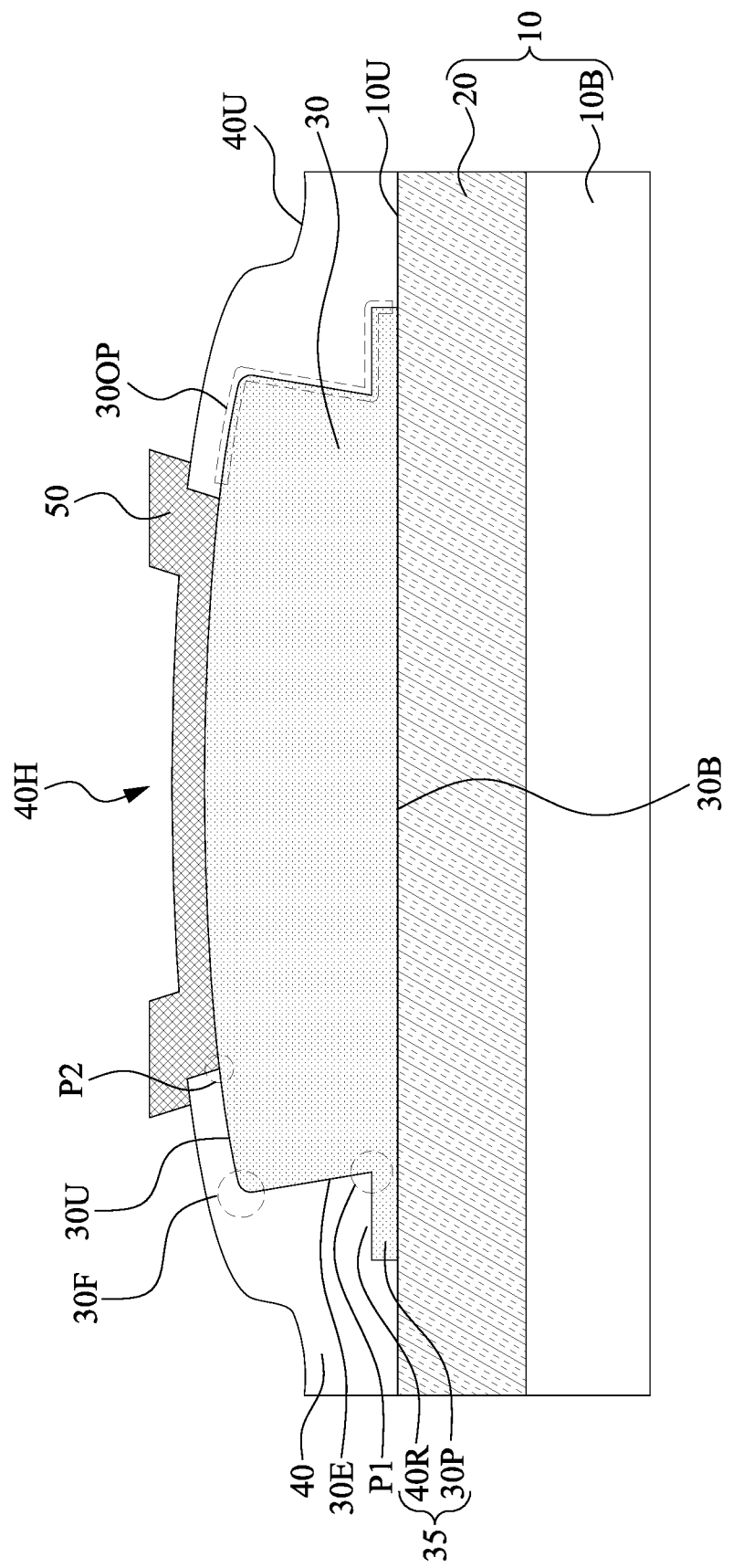
FIG. 2A is a schematic cross-sectional view along line A-A' in FIG. 1 in accordance with some other arrangements of the present disclosure.
Figure 2B:
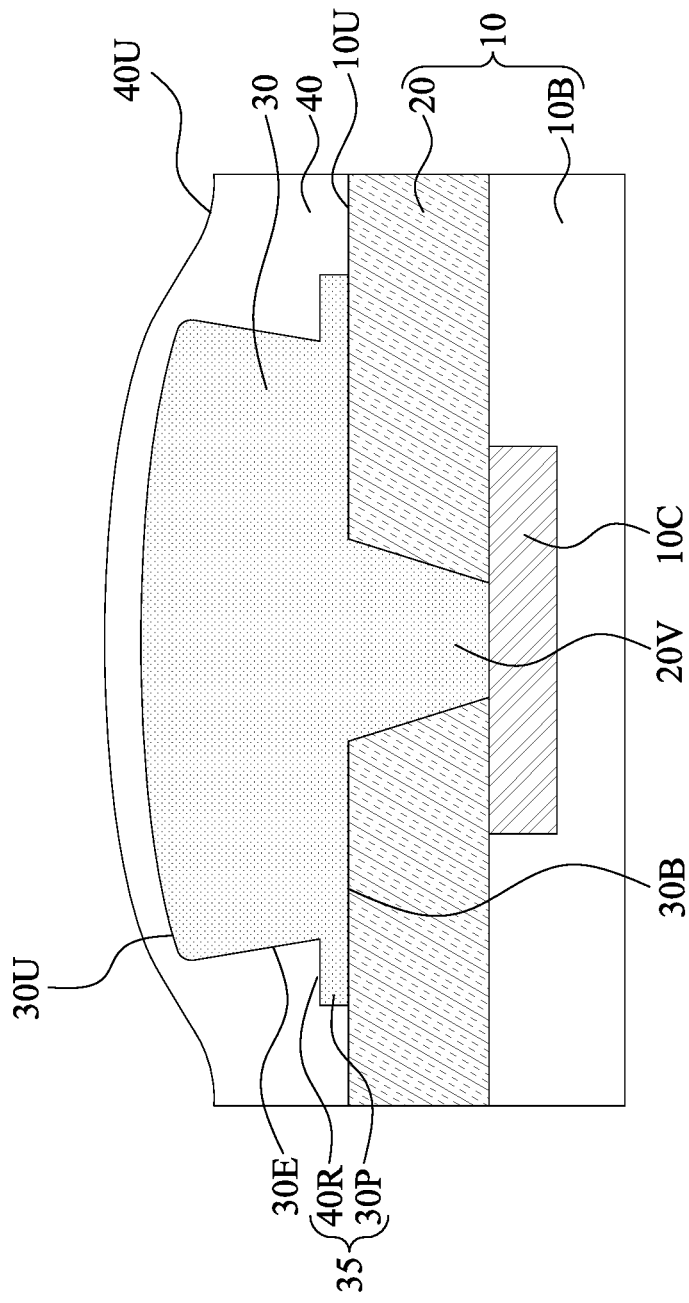
FIG. 2B is a schematic cross-sectional view along line B-B' in FIG. 1 in accordance with some arrangements of the present disclosure.

FIG. 2A is a schematic cross-sectional view along line A-A' in FIG. 1A in accordance with some other arrangements of the present disclosure, FIG. 2B is a schematic cross-sectional view along line B-B' in FIG. 1A in accordance with some other arrangements of the present disclosure. As shown in FIG. 2A and FIG. 2B, in contrast to the electronic device package 1, the protrusion portion 30P of the electronic device package 2 is closer to the bottom surface 30B than to the upper surface 30U of the conductive trace 30. By way of example, the protrusion portion 30P protrudes out from the first portion P1 of the outer profile 30OP. and engaged with the recession portion 40R of the passivation layer 40. In some embodiments, a bottom surface 30YB of the stress barrier structure 35 and an upper surface 10U of the substrate 10 is substantially coplanar.

The protrusion portion 30P closer to the bottom surface 30B can mitigate propagation of delamination from the portion P1 proximal to the substrate 10 (i.e., from the bottom side).

Figure 3A:
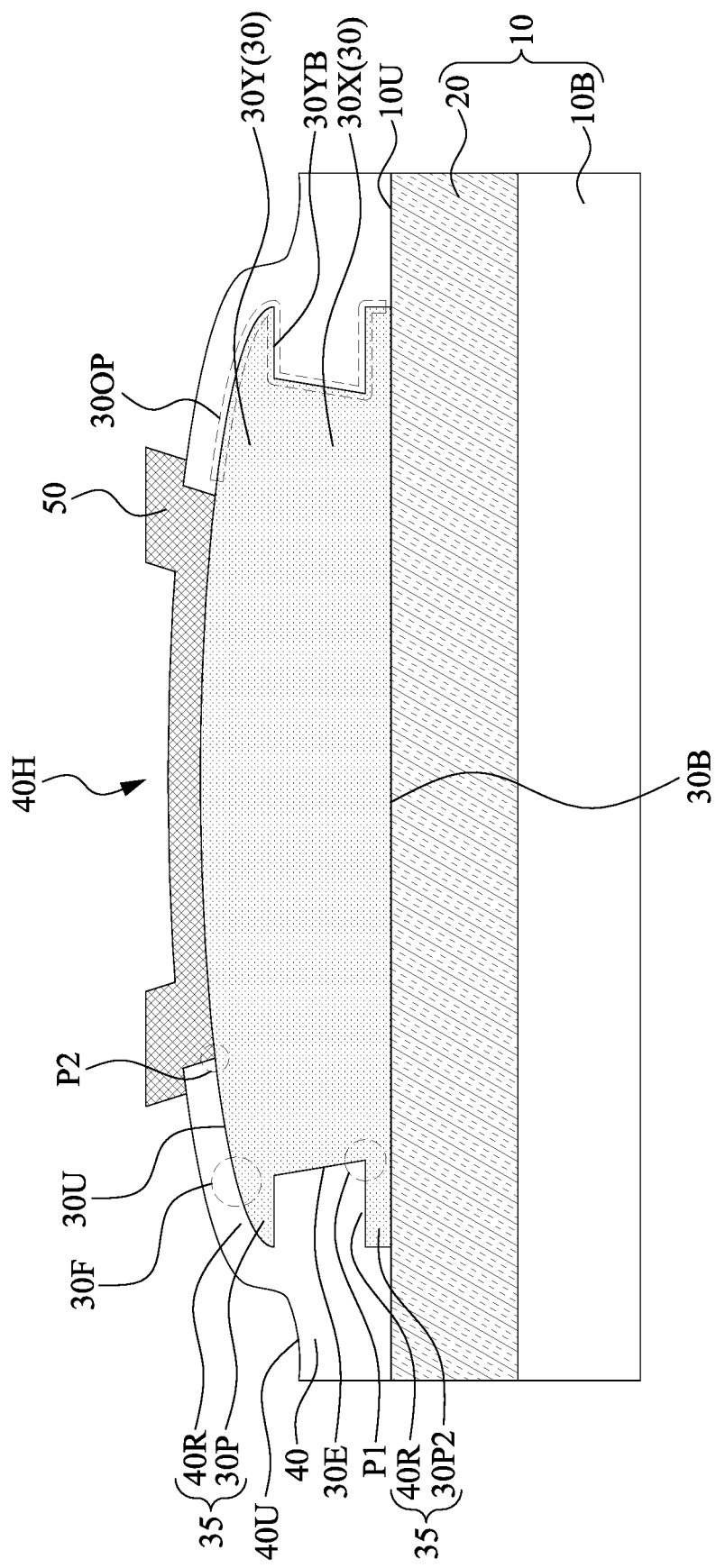
FIG. 3A is a schematic cross-sectional view along line A-A' in FIG. 1 in accordance with some other arrangements of the present disclosure.
Figure 3B:
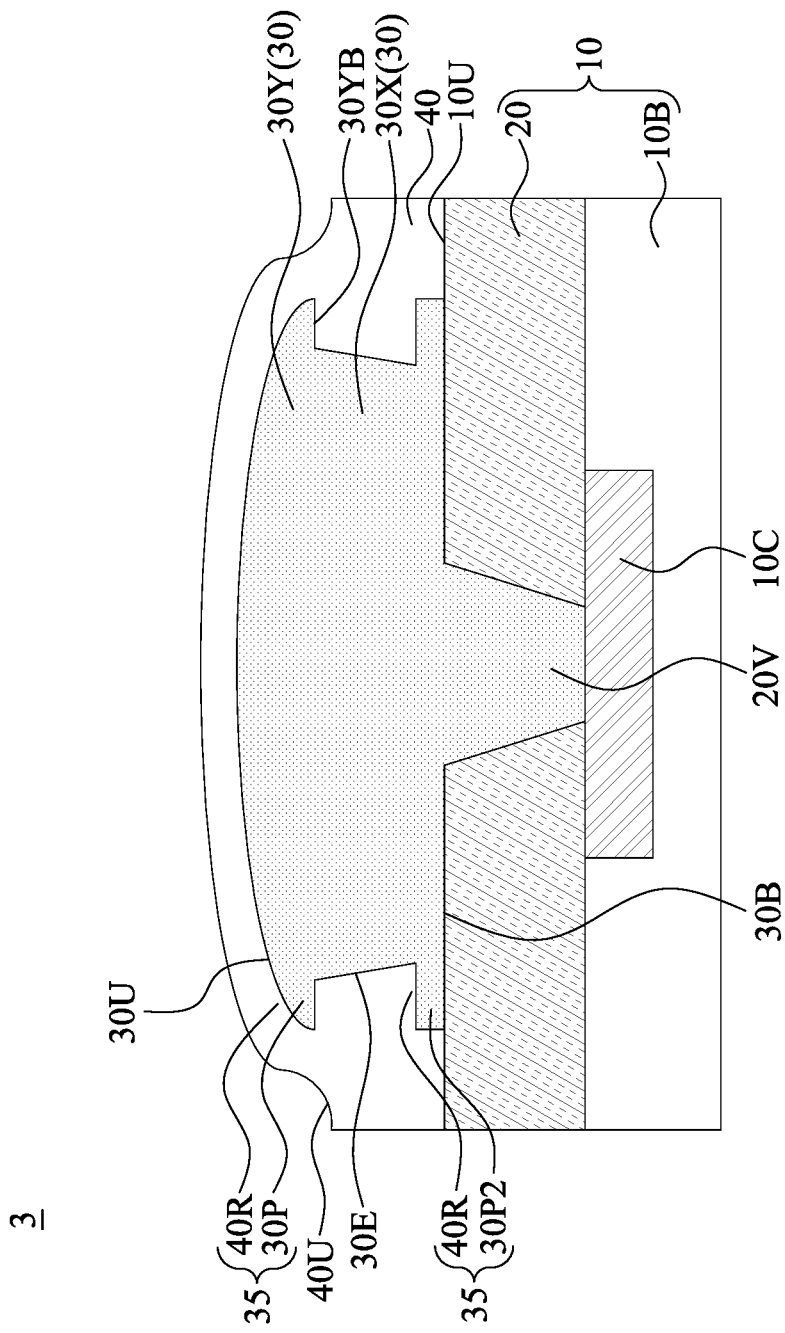
FIG. 3B is a schematic cross-sectional view along line B-B' in FIG. 1 in accordance with some arrangements of the present disclosure.

FIG. 3A is a schematic cross-sectional view along line A-A' in FIG. 1A in accordance with some other arrangements of the present disclosure, FIG. 3B is a schematic cross-sectional view along line B-B' in FIG. 1A in accordance with some other arrangements of the present disclosure. As shown in FIG. 3A and FIG. 3B, in contrast to the electronic device package 1, the outer profile 30OP of the electronic device package 3 includes a protrusion portion (also referred to a first protrusion portion) 30P and a second protrusion portion 30P2. Both the protrusion portion 30P and the second protrusion portion 30P2 may be between the first portion P1 and the second portion P2. By way of example, the protrusion portion 30P protrudes out from the boundary between the upper surface 30U and the edge 30E, and the second protrusion portion 30P2 protrudes out from the first portion P1 of the outer profile 30OP. Both the protrusion portion 30P and the second protrusion portion 30P2 may be engaged with the recession portion 40R of the passivation layer 40. The protrusion portion 30P can be configured to mitigate propagation of delamination from the second portion P2 (i.e., from the top side), while the second protrusion portion 30P2 can be configured to mitigate propagation of delamination from the first portion P1 proximal to the substrate 10 (i.e., from the bottom side).

Figure 4:
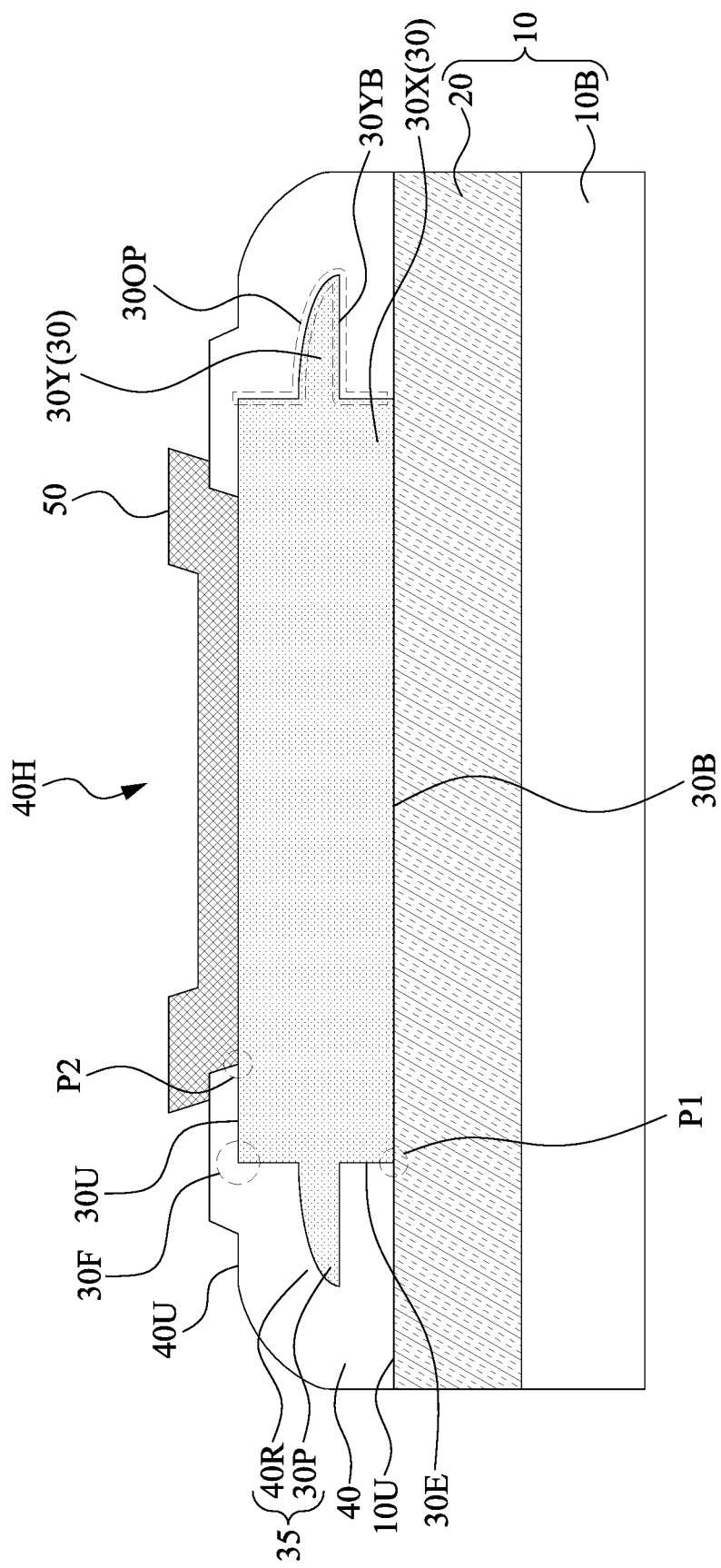
FIG. 4 is a schematic cross-sectional view of an electronic device package in accordance with some other arrangements of the present disclosure.

FIG. 4 is a schematic cross-sectional view of an electronic device package 4 in accordance with some other arrangements of the present disclosure. As shown in FIG. 4, in contrast to the electronic device package 1, the protrusion portion 30P of the electronic device package 4 protrudes out from the edge 30E of the conductive trace 30. By way of example, the protrusion portion 30P protrudes out from a middle part of the edge 30E of the conductive trace 30. The protrusion portion 30P protruding from the edge 30E can be configured to mitigate propagation of delamination from both the first portion P1 proximal to the substrate 10 (i.e., from the bottom side) and from the second portion P2 (i.e., from the top side).

Figure 5:
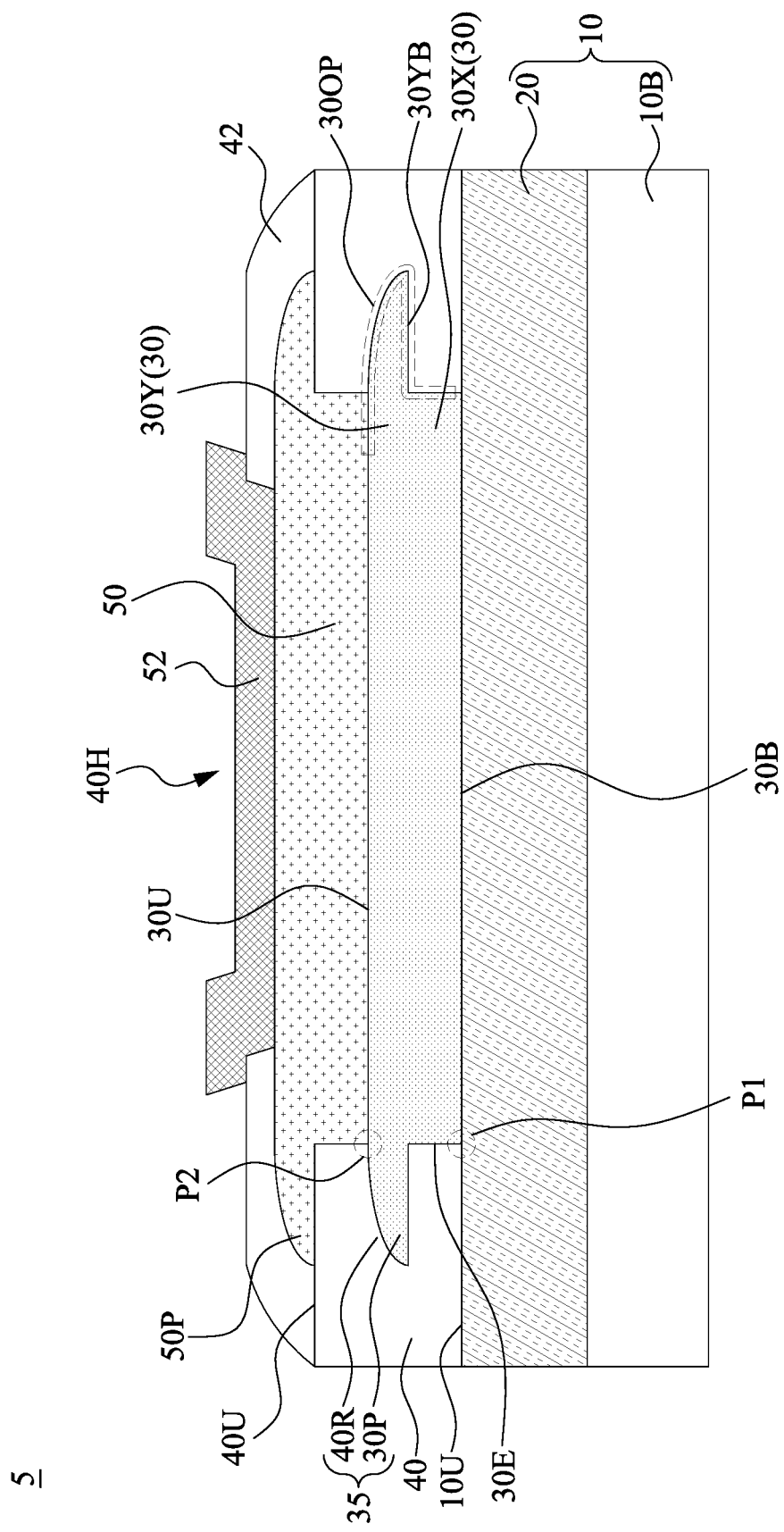
FIG. 5 is a schematic cross-sectional view of an electronic device package in accordance with some other arrangements of the present disclosure.

FIG. 5 is a schematic cross-sectional view of an electronic device package 5 in accordance with some other arrangements of the present disclosure. As shown in FIG. 5, in contrast to the electronic device package 1, the conductive trace 30 includes a first RDL, and the upper wiring 50 includes another conductive trace such as a second RDL. The electronic device package 5 further includes a UBM 52 disposed on and electrically connected to the upper wiring 50. In addition to the protrusion 30P of the conductive trace 30, the upper wiring 50 may also include a protrusion portion 50P interlocked with a second passivation layer 42. The protrusion portion 30P can mitigate propagation of delamination from the bottom side and the protrusion portion 50P can mitigate propagation of delamination from the top side.

Figure 6:
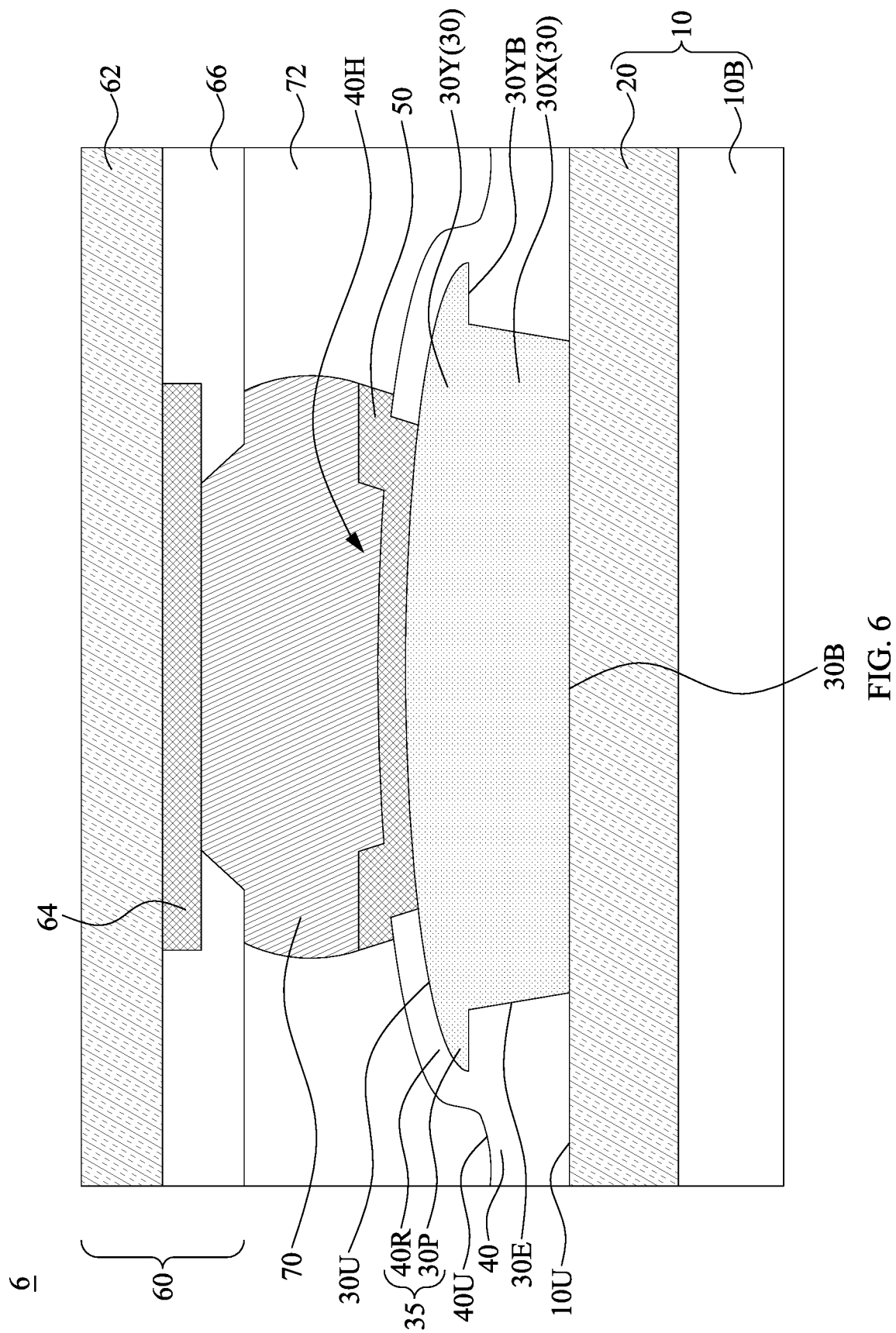
FIG. 6 is a schematic cross-sectional view of an electronic device package in accordance with some other arrangements of the present disclosure.

FIG. 6 is a schematic cross-sectional view of an electronic device package 6 in accordance with some other arrangements of the present disclosure. As shown in FIG. 6, in contrast to the electronic device package 1, 2, 3, 4 or 5, the electronic device package 6 may further include an electronic component 60, a solder material 70 and an encapsulation layer 72. The electronic component 60 is disposed over the upper wiring 50. In some embodiments, the electronic component 60 may include a package, a semiconductor die, a circuit layer such as an RDL or other electronic component. By way of example, the electronic component 60 may include a circuit layer 62, a contact pad 64 electrically connected to the circuit layer 62, and a passivation layer 66 disposed on the circuit layer 62 and exposing the contact pad 64. The solder material 70 such as a solder ball or a solder bump is disposed between the upper wiring 50, which may be configured as a UBM, and the electronic component 60, and electrically connected to the upper wiring 50 and the electronic component 70. The encapsulation layer 72 such as a molding compound is disposed between the electronic component 60 and the passivation layer 50, and encapsulating the solder material 70. The conductive trace 30 of the electronic device package 6 may include the protrusion portion 30P and/or the second protrusion portion 30P2 as illustrated in FIGS. 1-5, and details of the protrusion portion 30P and/or the second protrusion portion 30P2 are described in related paragraphs.

Figure 7A:
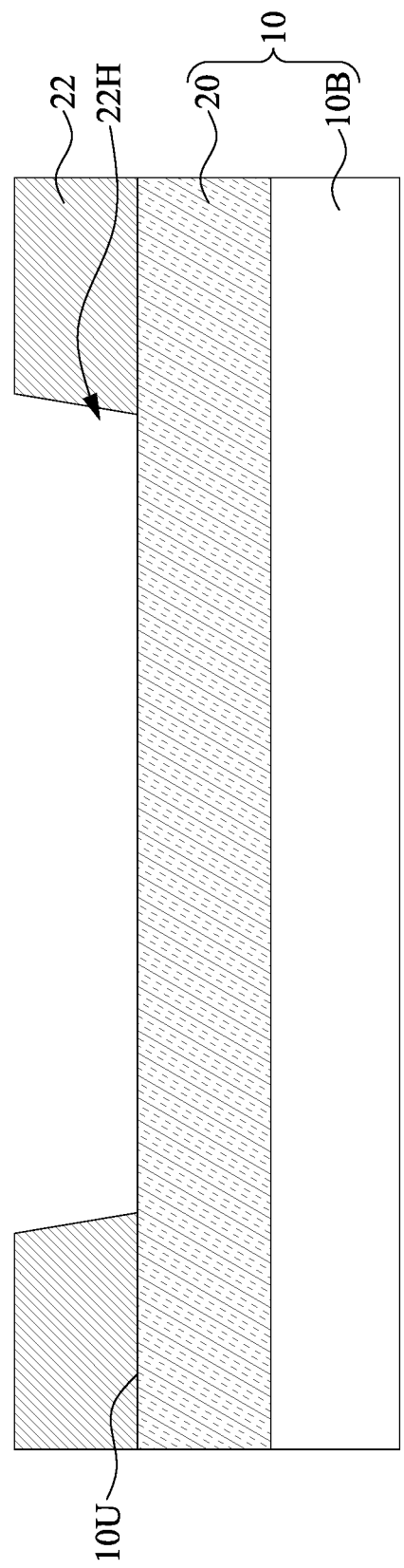
FIG. 7A, FIG. 7B, FIG. 7C and FIG. 7D illustrate operations of manufacturing an electronic device package in accordance with some arrangements of the present disclosure.
Figure 7B:
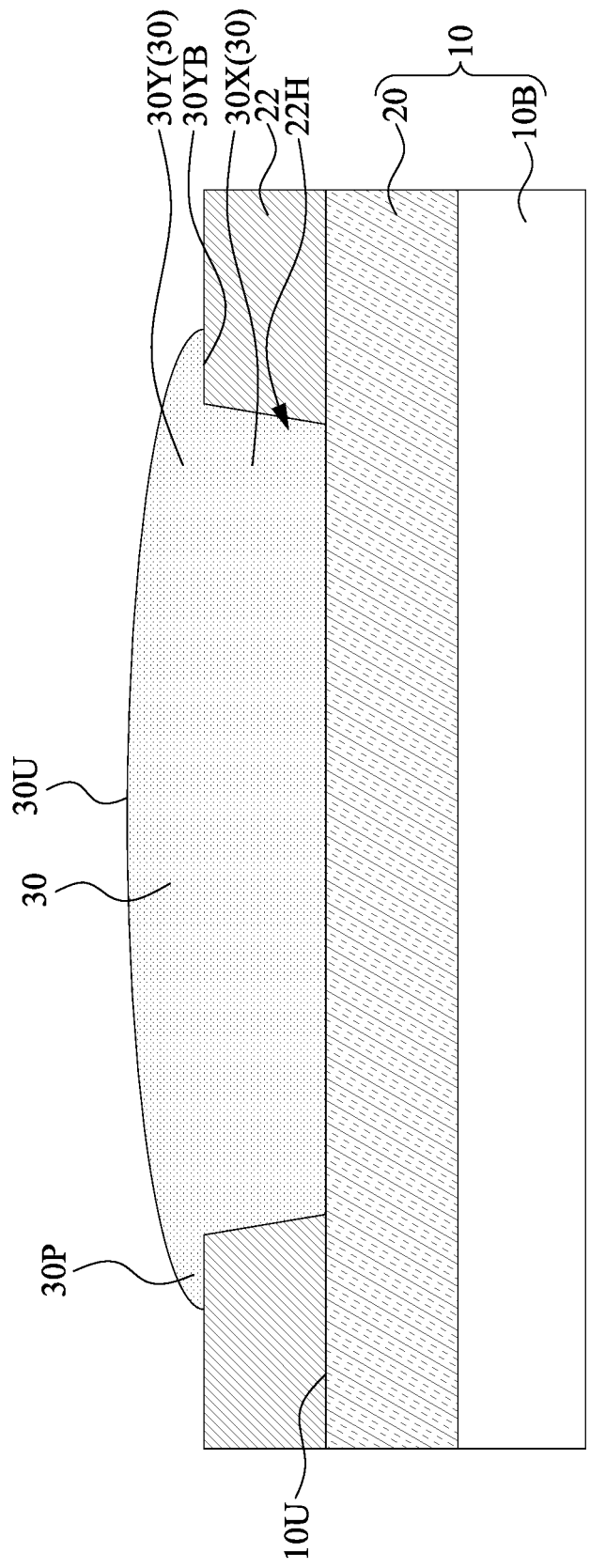

FIG. 7A, FIG. 7B, FIG. 7C and FIG. 7D illustrate operations of manufacturing an electronic device package in accordance with some arrangements of the present disclosure. As shown in FIG. 7A, a sacrificial layer 22 with a hole 22H is formed over a dielectric layer 20 of a substrate 10. In some embodiments, the sacrificial layer 22 may include a photo-sensitive material such as photoresist, and can be patterned to form the hole 22H by a photolithography operation. As shown in FIG. 7B, a conductive material is electroplated in the hole 22H of the sacrificial layer 22 to form a conductive trace 30. The conductive material may be excessively electroplated such that the conductive trace 30 protrudes out from the hole 22H and a protrusion portion 30P is formed to partially cover the sacrificial layer 22. In some embodiments, the conductive trace 30 includes a curved upper surface 30U.

Figure 7C:
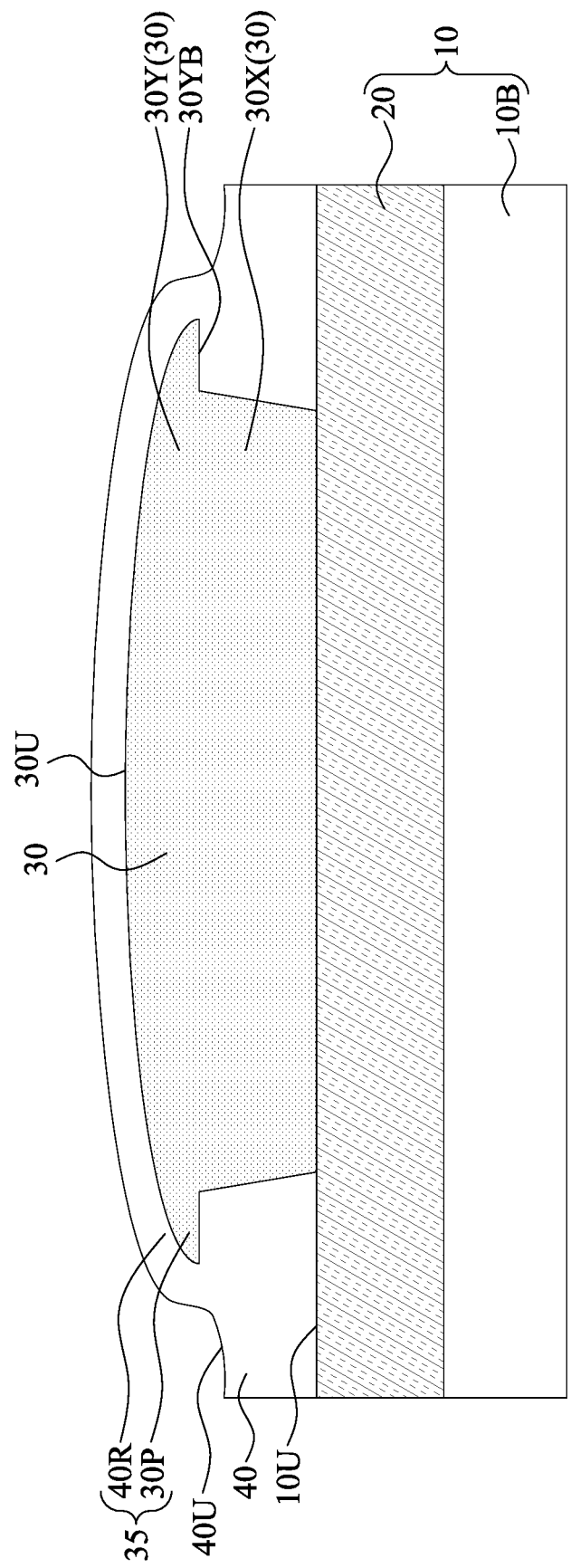
Figure 7D:
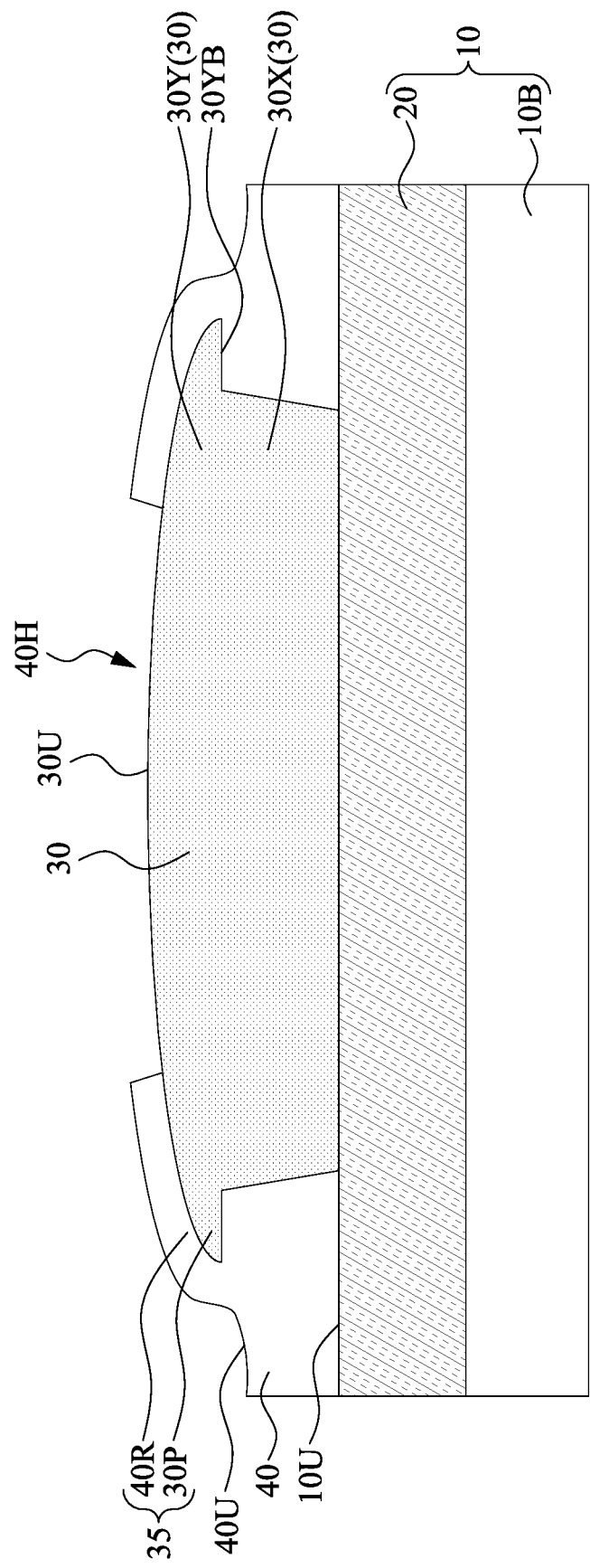

As shown in FIG. 7C, the sacrificial layer 22 is removed. Subsequently, a passivation layer 40 is formed to cover the conductive trace 30 and to interlock with the protrusion portion 30P of the conductive trace 30. In some embodiments, a portion of the passivation layer 40 is conformal with respect to the curved upper surface 30U. As shown in FIG. 7D, the passivation layer 40 is patterned to form an opening 40H partially exposing the conductive trace 30 by a photolithography operation. Then, a upper wiring 50 such as a UBM may be formed to manufacture the electronic device package 1 as illustrated in FIGS. 1 and 1A-1F.

Figure 8A:
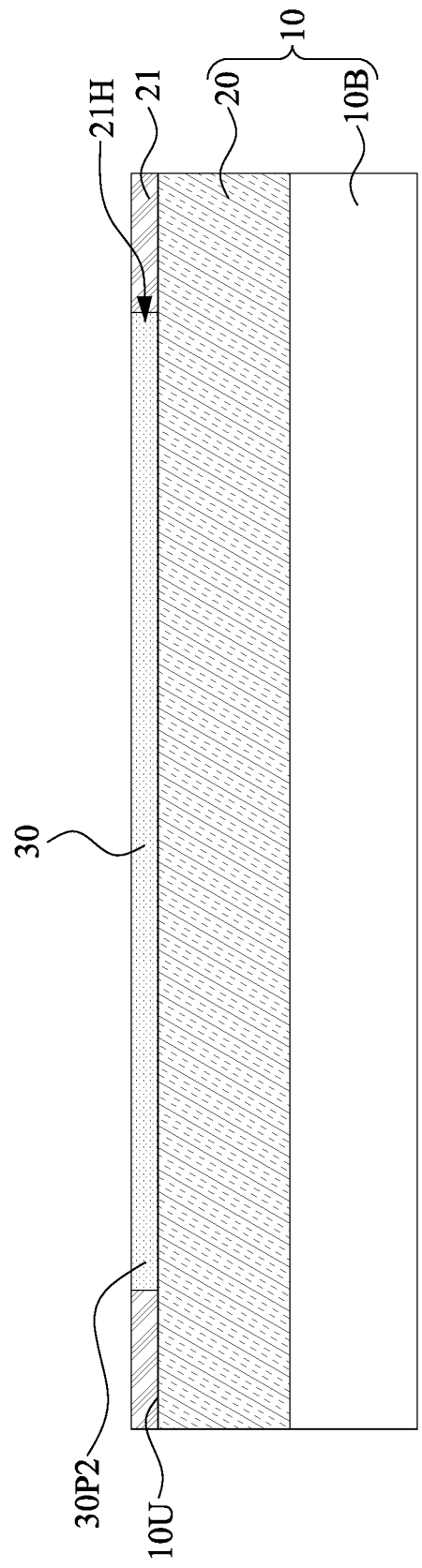
FIG. 8A, FIG. 8B and FIG. 8C illustrate operations of manufacturing an electronic device package in accordance with some arrangements of the present disclosure.
Figure 8B:
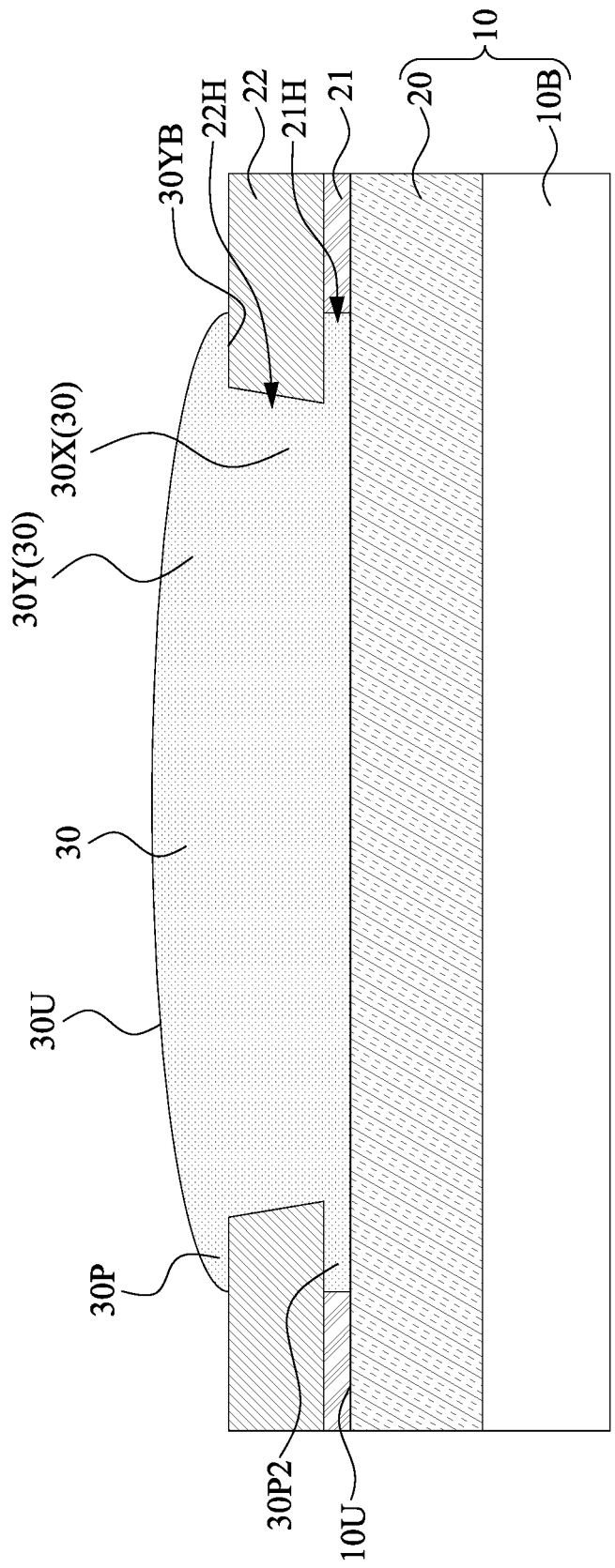
Figure 8C:
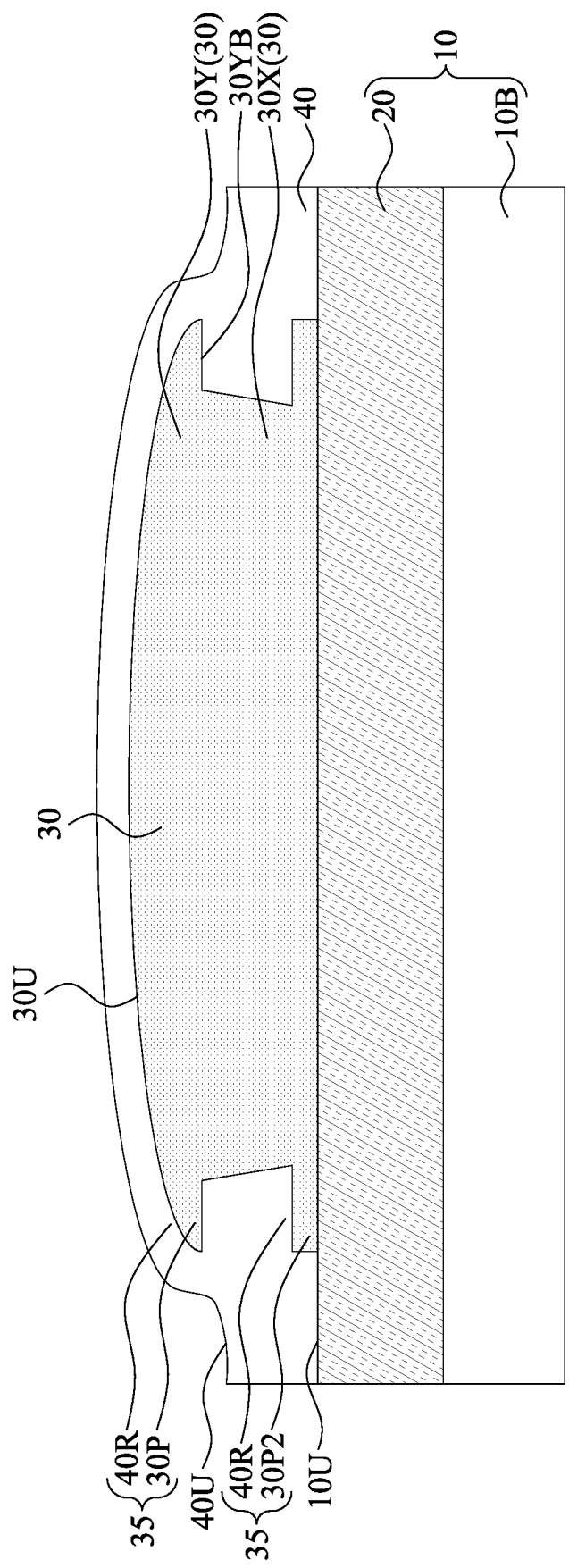

FIG. 8A, FIG. 8B and FIG. 8C illustrate operations of manufacturing an electronic device package in accordance with some arrangements of the present disclosure. As shown in FIG. 8A, a sacrificial layer 21 with a hole 21H is formed over a dielectric layer 20 of a substrate 10. A conductive material is electroplated in the hole 21H of the sacrificial layer 21 to form a portion of a conductive trace 30 having a second protrusion portion 30P2. As shown in FIG. 8B, another sacrificial layer 22 with a hole 22H is formed over sacrificial layer 21, wherein the hole 22H is smaller than the hole 21H. Subsequently, another portion of the conductive trace 30 is formed by electroplating to form a protrusion portion 30P. As shown in FIG. 8C, the sacrificial layers 21 and 22 are removed. Subsequently, a passivation layer 40 is formed to cover the conductive trace 30 and to interlock with the protrusion portion 30P and the second protrusion portion 30P2 of the conductive trace 30. Then, the passivation layer 40 may be patterned, and a upper wiring 50 such as a UBM may be formed to manufacture the electronic device package 2 as illustrated in FIGS. 2A and 2B.

Figure 9A:
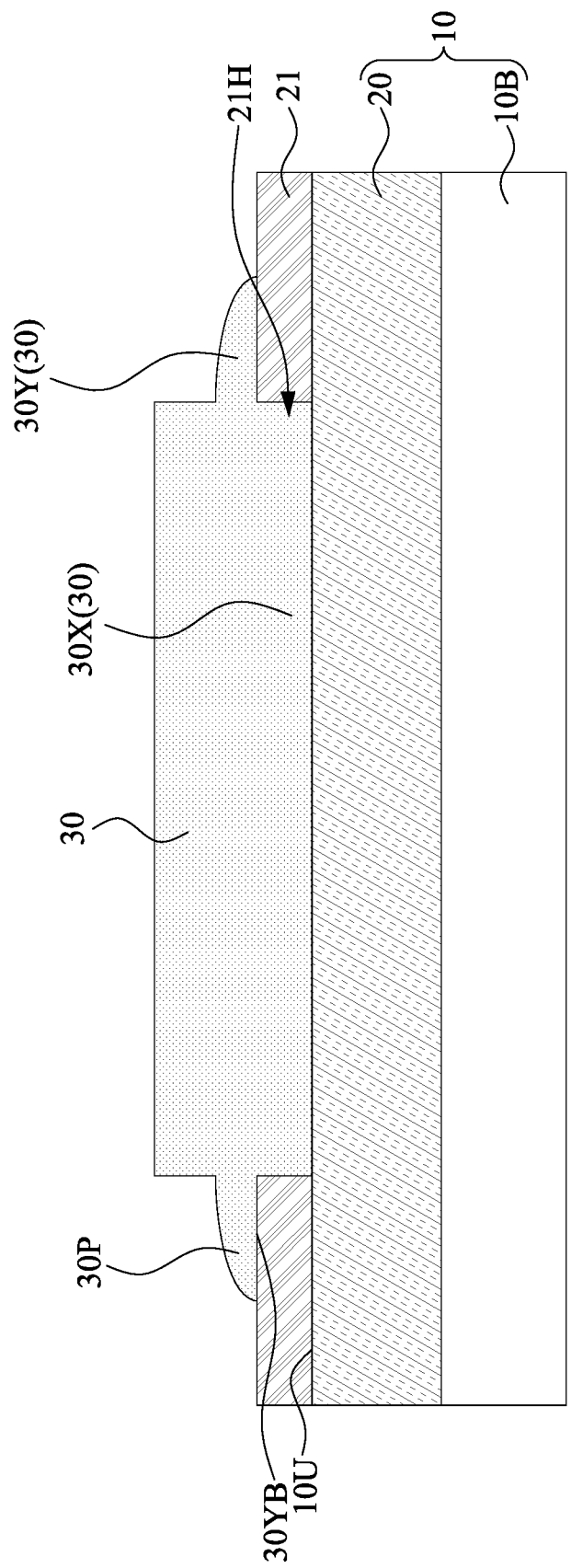
FIG. 9A, FIG. 9B and FIG. 9C illustrate operations of manufacturing an electronic device package in accordance with some arrangements of the present disclosure.
Figure 9B:
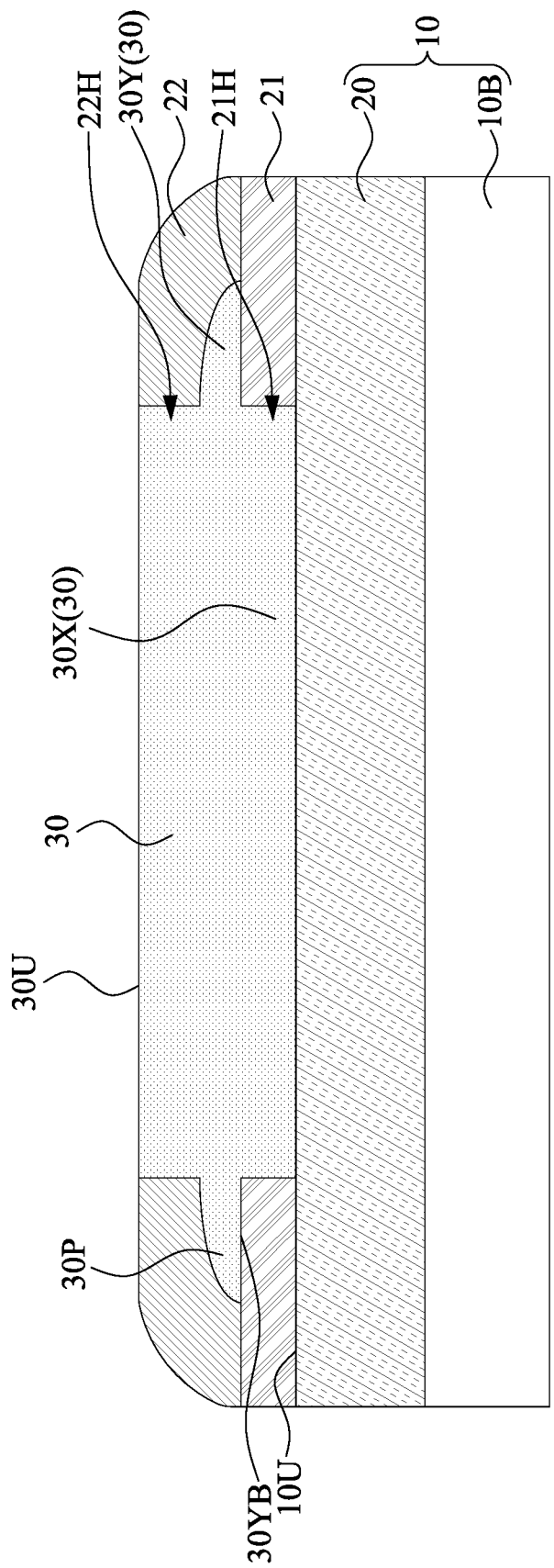
Figure 9C:
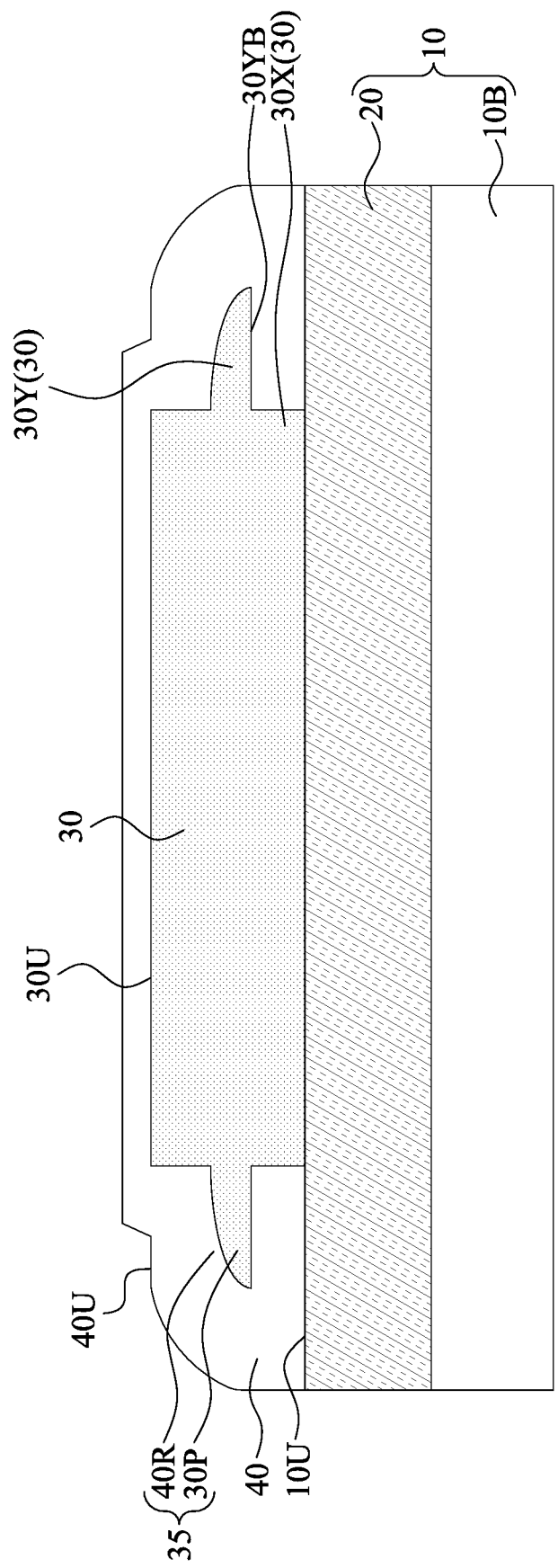

FIG. 9A, FIG. 9B and FIG. 9C illustrate operations of manufacturing an electronic device package in accordance with some arrangements of the present disclosure. As shown in FIG. 9A, a sacrificial layer 21 with a hole 21H is formed over a dielectric layer 20 of a substrate 10. A conductive material is electroplated in the hole 21H of the sacrificial layer 21 to form a portion of a conductive trace 30 having a protrusion portion 30P. As shown in FIG. 9B, another sacrificial layer 22 with a hole 22H is formed over sacrificial layer 21. Subsequently, another portion of the conductive trace 30 is formed by electroplating. As shown in FIG. 9C, the sacrificial layers 21 and 22 are removed. Subsequently, a passivation layer 40 is formed to cover the conductive trace 30 and to interlock with the protrusion portion 30P of the conductive trace 30. Then, the passivation layer 40 may be patterned, and an upper wiring 50 such as a UBM may be formed to manufacture the electronic device package 4 as illustrated in FIG. 4.

In some embodiments of the present disclosure, the conductive trace includes at least one protrusion portion protruding out laterally to engage with a recession portion of a passivation layer. The pair of protrusion portion and recession portion engage with each other, thereby forming an interlock structure structurally fastening the conductive trace and the passivation layer. The engaged protrusion portion and recession portion also form a stress barrier structure that mitigates or stops propagation of stress along the interface between the conductive trace and the passivation layer. Accordingly, delamination issue can be effectively alleviated.

In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device package, comprising:
 a conductive trace comprising a body portion and a cap portion on the body portion, wherein the cap portion comprises a protrusion protruded from a lateral surface of the body portion, the protrusion has a top surface and a bottom surface, and the bottom surface of the protrusion is closer to the lateral surface of the body portion than the top surface of the protrusion is; and a passivation layer comprising a first portion extending continuously on the protrusion and from the top surface to the bottom surface of the protrusion, and there is no inter-passivation layer interface formed within the first portion of the passivation layer, wherein the passivation layer further comprises a second portion extending along the lateral surface of the body portion, and there is no inter-passivation layer interface formed between the first portion and the second portion of the passivation layer, wherein the passivation layer comprises a first convex portion disposed over the conductive trace and extending in an extending direction of a routing portion of the conductive trace in a top view perspective, wherein the passivation layer further comprises a second convex portion disposed over the conductive trace and connected to the first convex portion, and a width of the second convex portion is greater than a width of the first convex portion in the top view perspective, and wherein the second convex portion has a substantially rounded edge in the top view perspective.

2. The electronic device package of claim 1, wherein the second convex portion has an opening exposing the conductive trace.

3. The electronic device package of claim 1, wherein an elevation of the bottom surface of the protrusion is higher than an elevation of a top surface of a lower portion of the passivation layer with respect to a bottom surface of the conductive trace.

4. The electronic device package of claim 3, wherein the lateral surface of the body portion of the conductive trace has a recess portion, and the top surface of the lower portion of the passivation layer horizontally overlaps the recess portion.

5. The electronic device package of claim 3, wherein the lower portion of the passivation layer is outside of a vertical projection of the conductive trace.

6. The electronic device package of claim 1, wherein, in a cross-sectional view, a distance between a lateral surface of the passivation layer and an end of the protrusion at an elevation of the bottom surface of the protrusion is greater than a width of the bottom surface of the protrusion at the elevation.

7. The electronic device package of claim 1, wherein the passivation layer further comprises:
  a lower portion outside of a vertical projection of the first convex portion; and
  a connection portion connecting the first convex portion and the lower portion and extending in the extending direction.

* * * * *